United States Patent [19]

Ogirima et al.

[11] B 4,007,074
[45] Feb. 8, 1977

[54] METHOD OF MAKING AN EPITAXIAL GROWTH LAYER OF $GAAS_{1-x}P_x$ COMPOUND SEMICONDUCTOR

[75] Inventors: Masahiko Ogirima, Shinjyuku; Toshimitu Shinoda, Hamura; Yuichi Ono, Kokubunji; Hajime Kusumoto, Tama, all of Japan

[73] Assignee: Hitachi, Ltd., Japan
[22] Filed: Jan. 8, 1971
[21] Appl. No.: 105,006
[44] Published under the second Trial Voluntary Protest Program on March 23, 1976 as document No. B 105,006.

[30] Foreign Application Priority Data

Jan. 9, 1970 Japan .................................. 45-2487
Jan. 9, 1970 Japan .................................. 45-2488

[52] U.S. Cl. .................. 148/175; 156/610; 156/613; 252/62.3 GA
[51] Int. Cl.$^2$ ................. H01L 21/205; H01L 21/18
[58] Field of Search ............... 148/1.5, 17 S; 117/106 A, 107.2, 201, 156 (610), 613; 252/62.3 GA

[56] References Cited

UNITED STATES PATENTS

| | | | |
|---|---|---|---|
| 3,146,137 | 8/1964 | Williams | 148/175 |
| 3,218,205 | 11/1965 | Ruehrwein | 148/175 |
| 3,312,570 | 4/1967 | Ruehrwein | 148/175 |
| 3,322,575 | 5/1967 | Ruehrwein | 148/175 X |
| 3,421,952 | 1/1969 | Conrad et al. | 148/175 |
| 3,441,000 | 4/1969 | Burd et al. | 148/175 X |
| 3,462,323 | 8/1969 | Groves | 148/175 |
| 3,471,324 | 10/1969 | Wilson et al. | 117/106 A X |

OTHER PUBLICATIONS

Weinstein, et al., "Prep. and Properties of GaAs–GaP—Heterojunctions".
Ibid vol. 111, No. 6, June 1964, pp. 674–682.
Tietjen et al., "All–in–one Process for Building Junctions", Electronics, Nov. 13, 1967, pp. 113–115.
Shaw et al., "Gallium Arsenide Epitaxial Technology", 1966, Symposium on GaAs, Reading, Sept. 1966, pp. 10–15.
Eddolls et al., "Prep. and Properties of Epitaxial Gallium Arsenide".
Ibid, pp. 3–9.
Finch et al., "Preparation of $GaAs_xP_{1-x}$ by Vapor Phase Reaction", J. Electrochem. Soc., vol. 111, No. 7, July 1964, pp. 814–817.
Ing et al., "Open Tube Epitaxial Synthesis of GaAs and GaP",
Ibid, vol. 109, No. 10, Oct. 1962, pp. 995–997.
Effer, D., "Epitaxial Growth of Doped and Pure GaAs—System".
Ibid, vol., 112, No. 10, Oct. 1965, pp. 1020–1025.
Tietjen et al., "Prep. and Properties of Vapor–Deposited—Phosphine".
Ibid, vol. 113, No. 7, July 1966, pp. 724–728.

*Primary Examiner*—L. Dewayne Rutledge
*Assistant Examiner*—W. G. Saba
*Attorney, Agent, or Firm*—Craig & Antonelli

[57] ABSTRACT

A layer of $GaAs_{1-x}P_x$ ($0<x<1$) is epitaxially grown on GaAs which is disposed in a reaction tube at a different location from the Ga source by maintaining the GaAs at a temperature range of from about 750° C. to about 850° C., maintaining the Ga source at a temperature higher than that of the GaAs, introducing $As_4$ gas, $PCl_3$ gas and $H_2$ gas or $AsCl_3$ gas, $P_4$ gas and $H_2$ gas into the reaction tube from the Ga source side, whereby said gases react with the Ga source and produce GaCl gas, and contacting said gases including the GaCl gas with the surface of the GaAs.

18 Claims, 4 Drawing Figures

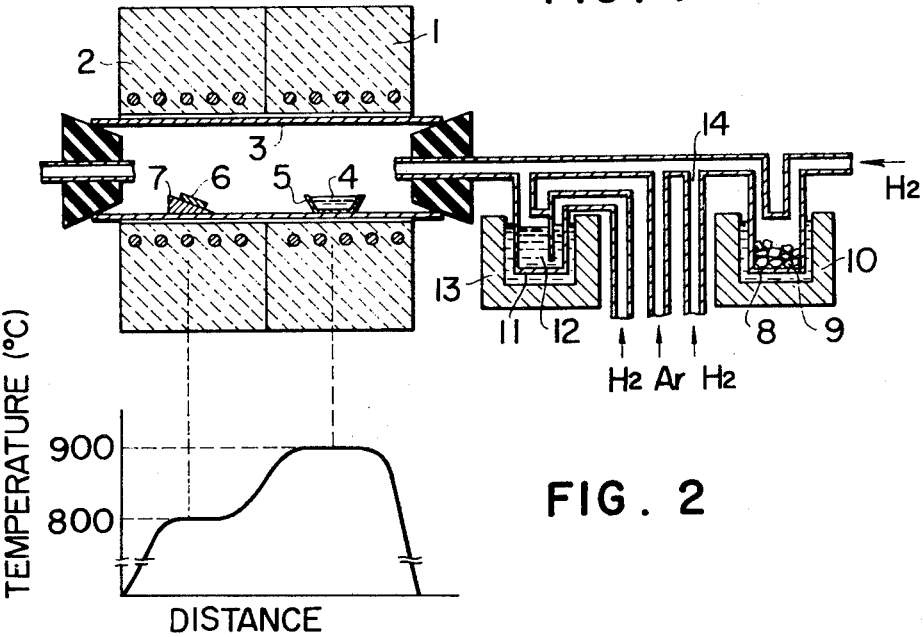
FIG. 1
FIG. 2
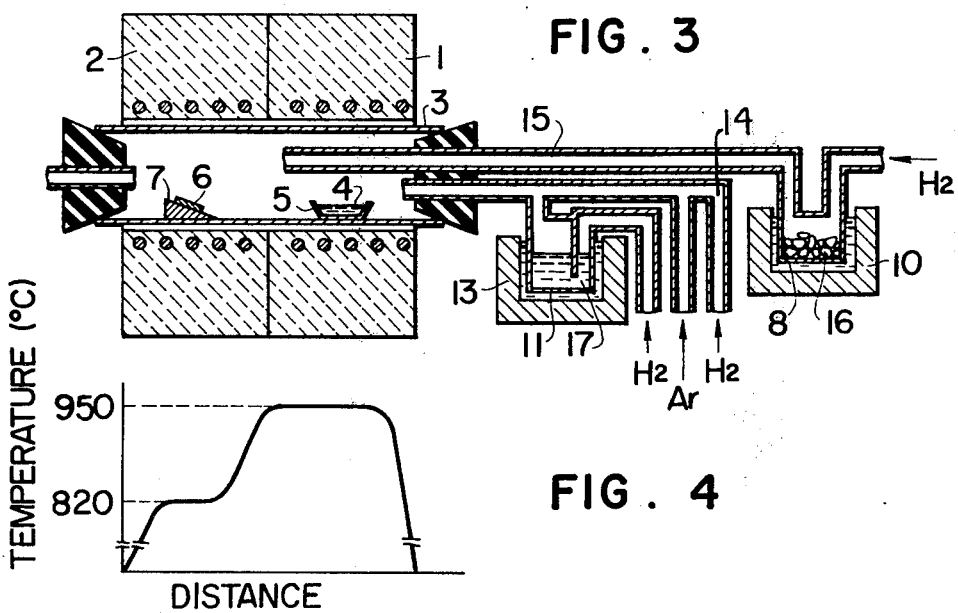
FIG. 3
FIG. 4
INVENTORS
MASAHIKO OGIRIMA, TOSHIMITU SHINODA, YUICHI ONO & HAJIME KUSUMOTO
BY Craig, Antonelli, Stewart & Hill
ATTORNEYS

METHOD OF MAKING AN EPITAXIAL GROWTH LAYER OF GAAS$_{1-x}$P$_x$ COMPOUND SEMICONDUCTOR

This invention relates to a method of making an epitaxial growth layer of GaAs$_{1-x}$P$_x$ ($0<x<1$) compound semiconductor.

It is generally known that a p-n junction within a vapor growth layer of GaAs$_{1-x}$P$_x$ emits a red light having a wavelength of 6540 A when x is 0.4 and a forward threshold current is applied, and that a light emitted from a p-n junction within a vapor growth layer of GaAs$_{1-x}$P$_x$ varies from about 5600 A to about 9000 A when x is varied between 0 and 1. Elements utilizing this characteristic are used in light emissive diodes, indicating lamps, indicating devices for figures and numerals, devices for recording sound signals on films and transistor or integrated circuit devices which utilize a light as a signal transmissive medium, because the elements have such characteristics as a small size, a movement by a low voltage and small electric current, a long life and a high dependability.

There are two conventional methods commonly employed for producing the vapor growth layer of GaAs$_{1-x}$P$_x$; one method uses a Ga-AsCl$_3$-PCl$_3$-H$_2$ system and the other a Ga-AsH$_3$-PH$_3$-HCl-H$_2$ system. In these methods, Ga is used as a source material together with a seed material of a semiconductor material which is crystallographically compatible with GaAs$_{1-x}$P$_x$. Thus, the seed material, such as a material having a zinc blende type crystalline structure or a diamond type crystalline structure on which the layer of GaAs$_{1-x}$P$_x$ is epitaxially grown, and the Ga source material are disposed and spaced from each other in a reaction tube, such as a quartz tube. The reaction tube is heated so that the Ga is held at a higher temperature than that of the seed material.

In the method utilizing the Ga-AsCl$_3$-PCl$_3$-H$_2$ system, AsCl$_3$ and PCl$_3$ entrained on a hydrogen stream are supplied to the reaction tube in gaseous form. The Ga, PCl$_3$, AsCl$_3$ and H$_2$ react to form a gaseous source material including GaCl, As$_4$, P$_4$ and HCl, for example. These gaseous source materials contact the seed material so as to cause a layer of GaAs$_{1-x}$P$_x$ to grow epitaxially on the seed material.

In the method utilizing the Ga-PH$_3$-AsH$_3$-HCl-H$_2$ system, HCl, AsH$_3$ and PH$_3$ entrained on a hydrogen stream are supplied to the reaction tube in gaseous form. The Ga and HCl react to form a GaCl gas including H$_2$. The GaCl, H$_2$, PH$_3$ and AsH$_3$ react to form a gaseous source material including GaCl, As$_4$, P$_4$ and HCl gas, for example. This gaseous source material contacts the seed material so as to cause a layer of GaAs$_{1-x}$P$_x$ to grow epitaxially on the seed material.

In these two conventional methods, x is controlled by the ratio of PCl$_3$/AsCl$_3$ or PH$_3$/AsH$_3$.

These two conventional methods are described, for example, in the following papers:
1. W. F. Finch and E. W. Mehal, *Journal of The Electrochemical Society*, Vol. 111, No. 7, pp. 814–817, 1964.
2. J. J. Tietjen and J. A. Amick, *Journal of The Electrochemical Society*, Vol. 113, No. 7, pp. 724–728, 1966.

However, there are several drawbacks in these conventional methods. In these methods, the quantitites of As and P in the epitaxial growth layer of GaAs$_{1-x}$P$_x$ should be controlled by the fluxes of PCl$_3$ and AsCl$_3$ or PH$_3$ and AsH$_3$. Generally, the control of fluxes is more difficult than that of temperature, and therefore it is very difficult to control the fluxes correctly and suitably. In particular, the control of fluxes of AsCl$_3$ and PCl$_3$ is quite difficult, since AsCl$_3$ and PCl$_3$ bubblers should be used. Therefore, it is very difficult to get an epitaxial growth layer of GaAs$_{1-x}$P$_x$ having a constant value of x.

Further, when it is required to employ dopants with the epitaxial growth layer of GaAs$_{1-x}$P$_x$, Ga including dopants, such as Te, Sn, S, Se and Zn therein, is used conventionally as a source, or a vapor of the dopants or compounds of the dopants are introduced into the reaction tube. However, these methods have various drawbacks, for example, the preparation of a Ga source containing the dopants is difficult, the control between the vapor pressure of the dopants and the quantities of flux thereof is difficult, etc.

One of the objects of the present invention is to provide an improved method of making an epitaxial growth layer of GaAs$_{1-x}$P$_x$ which overcomes the disadvantages and drawbacks of the prior art procedures.

Another object of this invention is to provide a method of making an epitaxial growth layer of GaAs$_{1-x}$P$_x$ having a constant value of x.

A further object of this invention is to provide a method of making an epitaxial growth layer of GaAs$_{1-x}$P$_x$, which is capable of doping with the layer easily.

A still further object of this invention is to provide a method of fabricating an epitaxial growth layer of GaAs$_{1-x}$P$_x$ whose growth rate is high.

These and other objects and advantages of the present invention will become apparent to those skilled in the art from a consideration of the following specification and claims, taken in conjunction with the accompanying drawing.

Basically, this invention contemplates a method in which a source material including Ga and a seed material that is crystallographically compatible with GaAs$_{1-x}$P$_x$ are disposed in a reaction tube at a different location from each other; said source material is heated higher than said seed material; H$_2$ gas, a gaseous material selected from the group consisting of PCl$_3$ and AsCl$_3$, As$_4$ (when said gaseous material is PCl$_3$) or P$_4$ (when said gaseous material is AsCl$_3$) is supplied to the source material so as to form a reaction gas; and said reaction gas is supplied to the seed material so as to form an epitaxial growth layer of GaAs$_{1-x}$P$_x$ on said seed material.

In the accompanying drawing:
FIG. 1 schematically illustrates an apparatus for performing the method of this invention;
FIG. 2 shows the distribution of the temperature in the reaction tube in FIG. 1;
FIG. 3 schematically illustrates another apparatus for performing the method of this invention; and
FIG. 4 shows the distribution of the temperature in the reaction tube in FIG. 3.

Referring now to FIGS. 1 and 2, there are shown the apparatus and the distribution of the temperature utilized for making the epitaxial growth layer of GaAs$_{1-x}$P$_x$.

In FIG. 1, electric furnaces 1 and 2 surround a reaction tube 3, made of a material such as quartz. In the quartz reaction tube 3, a suitable mass of Ga 4 in a vessel 5, of a material such as quartz, and a seed material of GaAs 6 on a stage 7 are disposed as shown. The stage 7 is inclined so that the surface of the seed material 6 contacts the reaction gas uniformly and in order to maintain as narrow a temperature range as possible.

Argon gas is introduced into the reaction tube 3, to obtain an inert atmosphere in the reaction tube 3. Then the temperatures of the Ga 4 and GaAs 6 are controlled at 900°C. and 800°C., for example in the furnaces 1 and 2. An example of the temperature distribution in the reaction tube 3 is shown by the curve in FIG. 2. After the temperature in the reaction tube 3 becomes stable, the input of argon gas is stopped and $P_4$ gas and $AsCl_3$ gas entrained on $H_2$ are introduced into the reaction tube 3. $P_4$ gas entrained on $H_2$ is formed when $H_2$ passes through an evaporating vessel 8 in which elemental P 9 is maintained at 320°C. by a thermostat 10. The mixture of $H_2$ and $AsCl_3$ gas is formed when the $H_2$ passes through an $AsCl_3$ bubbler 11 in which $AsCl_3$ 12 is maintained at 50°C. by a thermostat 13. The quantities of $P_4$ gas and $AsCl_3$ gas are controlled by changing the temperatures of the thermostats 10 and 13 or by changing the ratio of $H_2$ gas passing through the evaporating vessels 8 and 11 with respect to the $H_2$ gas introduced into the reaction tube 3 from another path 14.

The gases introduced into the reaction tube 3 come into contact, first, with Ga 4 maintained at 900°C. and produce a reaction gas including GaCl gas. Then the reaction gas comes into contact with GaAs 6 maintained at 800°C. so as to form an epitaxial growth layer of $GaAs_{1-x}P_x$ thereon. Thus, the layer of $GaAs_{1-x}P_x$ grows epitaxially on GaAs 6.

FIG. 3 shows another embodiment of the invention. In FIG. 3, the same numerals as those in FIG. 1 depict the same parts. The difference between FIG. 1 and FIG. 3 is the method by which the gas is introduced into reaction tube 3. A gas-introducing tube 15 extends beyond Ga 4 for introducing gas produced in evaporating vessel 8 into the reaction zone, so that the layer of $GaAs_{1-x}P_x$ epitaxially grows on GaAs 6 with a high growth rate. In FIG. 3, $PCl_3$ 17 and elemental As 16 are held in evaporating vessels 8 and 11, respectively.

Argon gas is introduced into the reaction tube 3, to obtain an inert atmosphere in the reaction tube 3. Then the temperature of Ga 4 and GaAs 6 is controlled at 950°C. and 820°C., for example, with the furnaces 1 and 2. An example of the temperature distribution in the reaction tube 3 is shown by the curve in FIG. 4. After the temperature in the reaction tube 3 becomes stable, the flow of argon gas is stopped, and $As_4$ and $PCl_3$ gas entrained on $H_2$ is introduced into the reaction tube 3. At the same time, $As_4$ gas entrained on $H_2$ is introduced through the gas-introducing tube 15. $As_4$ gas entrained on $H_2$ is formed when $H_2$ passes through evaporating vessel 8 in which As element 16 is maintained at 400°C. by thermostat 10. The mixture of $H_2$ and $PCl_3$ gas is formed when $H_2$ passes through $PCl_3$ bubbler 11 in which $PCl_3$ 17 is maintained at 0°C. by thermostat 13. The quantities of $As_4$ gas and $PCl_3$ gas are controlled by changing the temperatures of the thermostats 10 and 13 or by changing the ratio of $H_2$ gas passing through the evaporating vessels 8 and 11 with respect to the $H_2$ gas introduced into the reaction tube 3 from another path 14.

The $PCl_3$ gas introduced into the reaction tube 3 first comes into contact with Ga 4 maintained at 950°C. and produces $P_4$ gas and GaCl gas. Then these gases meet $As_4$ gas at the reaction zone and become a reaction gas. The reaction gas comes into contact with GaAs 6 maintained at 820°C. so as to form an epitaxial growth layer of $GaAs_{1-x}P_x$ thereon. Thus, the layer of $GaAs_{1-x}P_x$ grows epitaxially on GaAs 6.

In the above-mentioned embodiments, the source material, the seed material, the As element and the P element are maintained at 900°C. or 950°C., 800°C. or 820°C., 400°C. and 320°C., respectively. However, in general, an epitaxial growth layer of $GaAs_{1-x}P_x$ is obtained on the seed material when these materials are maintained at temperature ranges from about 750°C. to about 1000°C., from about 750°C. to about 850°C., from about 350°C. to about 500°C. and from about 250°C. to about 350°C., respectively.

The $x$ value of the $GaAs_{1-x}P_x$ is controlled by controlling the temperatures of the vessels 8 and 11, or the quantities passed through vessels 8 and 11. The following Table 1 shows the results of an embodiment of the invention utilizing the apparatus shown in FIG. 3, that is, the relationships among the x value of the epitaxial growth layer of $GaAs_{1-x}P_x$, the flux of $H_2$ passed through the $PCl_3$, the temperature of the As and the total flux of $H_2$ in the reaction tube.

Table 1

| Flux of $H_2$ passed through $PCl_3$ (cc/min.) at 0°C. | Temperature of As (°C.) | Total Flux of $H_2$ in Reaction Tube (cc/min.) | x Value of $GaAs_{1-x}P_x$ |
| --- | --- | --- | --- |
| 40 | 420 | 250 | 0.42 |
| 40 | 450 | 250 | 0.23 |
| 60 | 450 | 250 | 0.31 |
| 60 | 400 | 250 | 0.58 |
| 50 | 410 | 250 | 0.46 |
| 30 | 450 | 250 | 0.18 |
| 30 | 410 | 250 | 0.34 |
| 30 | 400 | 250 | 0.49 |
| 30 | 380 | 250 | 0.67 |
| 80 | 440 | 250 | 0.43 |

As is apparent from Table 1, an epitaxial growth layer of $GaAs_{1-x}P_x$ having a desired composition is obtained easily by controlling the flux of $H_2$ passed through the $PCl_3$, the temperature of the As, or the flux of $H_2$ passed through the As; and the x value of $GaAs_{1-x}P_x$ is controlled easily by controlling the temperature of the As or by controlling the flux of $H_2$ passed through the As fixing the flux of $H_2$ passed through the $PCl_3$.

The quantities of dopants in the epitaxial growth layer of $GaAs_{1-x}P_x$ are controlled by controlling the ratio of doped GaAs or GaP to undoped GaAs or GaP which is mixed in the Ga source. As dopants, any doping materials, such as Te, Sn, S, Se and Zn, can be employed. The following Table 2 shows the results of an embodiment of the invention utilizing the apparatus shown in FIG. 1, that is, the relationship among the carrier concentration in $GaAs_{1-x}P_x$, the quantity of Ga source, the quantity of GaAs, the quantity of Te-doped GaAs and the total flux of $H_2$ in the reaction tube. In this case, the quantity of Te in the GaAs is $1 \times 10^{18}$ cm$^{-3}$.

Table 2

| Quantity of Ga source (gr.) | Quantity of GaAs (gr.) | Quantity of Te-doped GaAs (gr.) | Total Flux of H$_2$ in the Reaction Tube (cc/min.) | Carrier concentration in GaAs$_{1-x}$P$_x$ (cm$^{-3}$) |
| --- | --- | --- | --- | --- |
| 8 | 0.80 | 0.00 | 180 | $1.21 \times 10^{16}$ |
| 8 | 0.70 | 0.10 | 180 | $3.51 \times 10^{16}$ |
| 8 | 0.65 | 0.15 | 180 | $4.73 \times 10^{16}$ |
| 8 | 0.60 | 0.20 | 180 | $5.26 \times 10^{16}$ |
| 8 | 0.50 | 0.30 | 180 | $8.44 \times 10^{16}$ |
| 8 | 0.40 | 0.40 | 180 | $3.22 \times 10^{17}$ |
| 8 | 0.40 | 0.40 | 180 | $1.57 \times 10^{17}$ |
| 8 | 0.40 | 0.40 | 180 | $2.21 \times 10^{17}$ |
| 8 | 0.40 | 0.40 | 180 | $2.47 \times 10^{17}$ |
| 5 | 0.25 | 0.25 | 150 | $1.68 \times 10^{17}$ |
| 5 | 0.10 | 0.40 | 150 | $1.75 \times 10^{18}$ |

As is apparent from Table 2, the amount of dopant in the GaAs$_{1-x}$P$_x$ is easily controlled by controlling the ratio of GaAs or GaP including the dopant with respect to the GaAs or GaP which is mixed in the Ga source. In other words, the quantity of dopant in the GaAs$_{1-x}$P$_x$ is controlled by the quantity of dopant in the GaAs which is mixed in the Ga source.

The invention being thus described, it will be obvious that the same may be varied in many ways. Such variations are not to be regarded as a departure from the spirit and scope of the invention, and all such modifications as would be obvious to one skilled in the art are intended to be included herein.

We claim:

1. A method of making an epitaxial growth layer of GaAs$_{1-x}$P$_x$ ($0<x<1$) compound semiconductor on a seed material that is crystallographically compatible with the layer, comprising the steps of:
    disposing a source material including Ga and said seed material in a reaction tube spaced from each other;
    maintaining said source material at a temperature higher than that of said seed material;
    heating element As to a temperature so as to obtain a controlled amount of As$_4$ gas;
    heating elemental P to a temperature so as to obtain a controlled amount of P$_4$ gas;
    introducing a gaseous material selected from the group consisting of a mixture of PCl$_3$, As$_4$ gas produced from said heated elemental As and H$_2$ gas, or a mixture of P$_4$ gas produced from said heated elemental P, AsCl$_3$, and H$_2$ gas into the reaction tube so as to contact at least said gaseous material with said source material, whereby a reaction gas including GaCl is produced; and
    contacting said reaction gas with said seed material.

2. The method of claim 1, wherein said source material includes a member selected from the group consisting of GaAs and GaP having a dopant therein.

3. The method of claim 2, wherein said source material includes GaAs having a dopant therein.

4. The method of claim 2, wherein said source material includes GaP having a dopant therein.

5. The method of claim 1, wherein said gaseous material includes PCl$_3$.

6. The method of claim 1, wherein said gaseous material includes AsCl$_3$.

7. The method of claim 1, wherein said gaseous material is introduced into the reaction tube so as to contact with the source material, and As$_4$ gas or P$_4$ gas is introduced into the reaction zone in the reaction tube.

8. The method of claim 7, wherein said source material includes a material selected from the group consisting of GaAs and GaP having a dopant therein.

9. The method of claim 1, wherein the temperature of said source material is maintained at about 900° to 950°C. and the temperature of said seed material is maintained at about 800° to 820°C.

10. The method of claim 1, wherein the temperature of said source material is maintained at about 750° to 1000°C. and the temperature of said seed material is maintained at about 750° to 850°C.

11. The method of claim 9, wherein the temperature of the elemental As is maintained at about 400°C.

12. The method of claim 9, wherein the temperature of the elemental P is maintained at about 320°C.

13. The method of claim 10, wherein the temperature of the elemental As is maintained at about 350° to 500°C.

14. The method of claim 10, wherein the temperature of the elemental P is maintained at about 250° to 350°C.

15. The method of claim 1, wherein the $x$ value of the GaAs$_{1-x}$P$_x$ compound is controlled by controlling the temperature of the elemental As or the elemental P.

16. A method of forming an epitaxial growth layer of GaAs$_{1-x}$P$_x$ ($0<x<1$) compound semiconductor on a GaAs substrate, comprising the steps of:
    disposing a source material including Ga and said GaAs in a reaction tube spaced from each other;
    maintaining the temperature of the GaAs at about 750° to 850° C.;
    maintaining the Ga source at a temperature higher than that of the GaAs;
    heating elemental As in a temperature range from about 350° to 500° C. so as to obtain a controlled amount of As$_4$ gas;
    heating elemental P in a temperature range from about 250° to 350° C. so as to obtain a controlled amount of P$_4$ gas;
    introducing PCl$_3$ gas, As$_4$ gas having the controlled amount and H$_2$ gas, or AsCl$_3$ gas, P$_4$ gas having the controlled amount and H$_2$ gas, into the reaction tube from the Ga source side, whereby said gases react with the Ga source and produce GaCl gas; and
    contacting said gases including the GaCl gas with the surface of the GaAs.

17. The method of claim 16 wherein said source material includes GaAs or GaP having a dopant therein.

18. A method of making an epitaxial growth layer of GaAs$_{1-x}$P$_x$ ($0<x<1$) compound semiconductor on a seed material that is crystalographically compatible with the layer, comprising the steps of:
disposing a source material including Ga and said seed material into a reaction tube spaced from each other;
maintaining said source material at a temperature higher than that of said seed material;
maintaining elemental As at a temperature for obtaining $As_4$ gas having a certain amount;
maintaining elemental P at a temperature for obtaining $P_4$ gas having a certain amount;
introducing $PCl_3$ gas, $As_4$ gas having said certain amount and $H_2$ gas or $AsCl_3$ gas, $P_4$ gas having said certain amount and $H_2$ gas into the reaction tube, whereby a reaction gas including GaCl is produced; and
contacting the certain gas with said seed material.

* * * * *